(12) United States Patent
Ito et al.

(10) Patent No.: US 10,298,044 B2
(45) Date of Patent: May 21, 2019

(54) POWER TOOL FOR THE USE WITH A DETACHABLE BATTERY PACK THAT DETECTS THE TEMPERATURE OF THE BATTERY PACK

(71) Applicant: MAKITA CORPORATION, Anjo-shi, Aichi (JP)

(72) Inventors: Takaaki Ito, Anjo (JP); Takuya Umemura, Anjo (JP)

(73) Assignee: MAKITA CORPORATION, Anjo-Shi (JP)

( * ) Notice: Subject to any disclaimer, the term of this patent is extended or adjusted under 35 U.S.C. 154(b) by 413 days.

(21) Appl. No.: 15/170,488

(22) Filed: Jun. 1, 2016

(65) Prior Publication Data
US 2016/0359343 A1 Dec. 8, 2016

(30) Foreign Application Priority Data

Jun. 8, 2015 (JP) ................................. 2015-115878

(51) Int. Cl.
| | |
|---|---|
| *H01M 10/44* | (2006.01) |
| *H01M 10/46* | (2006.01) |
| *H02J 7/00* | (2006.01) |
| *B25F 5/00* | (2006.01) |
| *G01R 31/36* | (2019.01) |

(52) U.S. Cl.
CPC ............... *H02J 7/007* (2013.01); *B25F 5/00* (2013.01); *H02J 7/0021* (2013.01); *H02J 7/0029* (2013.01); *H02J 7/0063* (2013.01); *H02J 7/0091* (2013.01); *G01R 31/3675* (2013.01)

(58) Field of Classification Search
CPC ........ H02J 7/0052; H02J 7/007; H02J 7/0013; H02J 7/047; H02J 7/0091

USPC .................. 320/107, 114, 115, 150, 153
See application file for complete search history.

(56) References Cited

U.S. PATENT DOCUMENTS

| | | | |
|---|---|---|---|
| 5,872,453 A | 2/1999 | Shimoyama et al. | |
| 7,379,833 B2 | 5/2008 | Kamishima | |
| 8,173,287 B2 | 5/2012 | Sim | |
| 2006/0136163 A1 | 6/2006 | Kamishima | |
| 2009/0087725 A1 | 4/2009 | Sim | |
| 2014/0300366 A1* | 10/2014 | Kobayakawa | H01M 10/486 324/433 |
| 2016/0049636 A1* | 2/2016 | Takano | H01M 10/42 429/61 |

FOREIGN PATENT DOCUMENTS

| | | |
|---|---|---|
| EP | 1 047 174 A1 | 10/2000 |
| JP | 2005-269747 A | 9/2005 |

OTHER PUBLICATIONS

Jul. 10, 2018 Office Action issued in European Patent Application No. 16173163.3.
Nov. 21, 2016 Extended Search Report issued in European Patent Application No. 16173163.3.

* cited by examiner

*Primary Examiner* — Edward Tso
(74) *Attorney, Agent, or Firm* — Oliff PLC

(57) ABSTRACT

A device body in one aspect of the present disclosure comprises a motor, a current path, a positive terminal, a negative terminal, a device-side signal terminal, a temperature information detector, a current detector, and a correction unit. The correction unit is configured to correct temperature information based on a current value of a conducting current, so as to reduce an influence given to the temperature information by the conducting current.

21 Claims, 9 Drawing Sheets

FIG. 5

| | DETECTED DEVIATION VALUE Er (mV) | | | | | |
|---|---|---|---|---|---|---|
| BATTERY TEMPERATURE T1 (°C) ※ DETECTION VALUE | | ~15 | ~29 | ~43 | ~57 | ~70 | ·· |
| ⋮ | · | · | · | · | · | · |
| 70 | 70 | 69 | 68 | 67 | 66 | · |
| 71 | 71 | 70 | 69 | 68 | 67 | · |
| ⋮ | · | · | · | · | · | · |

FIG. 8

| DETECTED DEVIATION VALUE Er (mV) | ~15 | ~29 | ~43 | ~57 | ~70 | . . |
|---|---|---|---|---|---|---|
| CORRECTED LOW TEMPERATURE SIDE THRESHOLD Tar (°C) | -30 | -29 | -28 | -27 | -26 | . . |
| CORRECTED HIGH TEMPERATURE SIDE THRESHOLD Tbr (°C) | 70 | 71 | 72 | 73 | 74 | . . |

POWER TOOL FOR THE USE WITH A DETACHABLE BATTERY PACK THAT DETECTS THE TEMPERATURE OF THE BATTERY PACK

CROSS-REFERENCE TO RELATED APPLICATIONS

This application claims the benefit of Japanese Patent Application No. 2015-115878 filed Jun. 8, 2015 in the Japan Patent Office, and the entire disclosure of Japanese Patent Application No. 2015-115878 is incorporated herein by reference.

BACKGROUND

The present disclosure relates to temperature detection of a battery.

A motor-driven device is known which is provided with a device body and a battery pack.

A known device body is configured to be able to attach and detach a battery pack, and has a motor to be driven by electric power supplied from the battery pack.

An example of a device body disclosed in Japanese Unexamined Patent Application Publication No. 2005-269747 is configured to detect temperature of a battery based on a resistance value of a thermistor (temperature detector) provided in a battery pack, and control a conducting current to a motor based on the detected temperature. Specifically, in this example, if the battery temperature exceeds a reference temperature, an amount of current to be supplied from the battery pack to the motor is reduced.

Thus, in this example, it is possible to avoid an excessive load due to high temperature from being applied to the battery. The lifetime of the battery pack can be prolonged.

SUMMARY

In a device body, when there is a partial overlap between a current path for detecting a voltage that changes in accordance with a resistance value of a thermistor (thermistor voltage) and a current path for a conducting current to a motor, a detection value (voltage value) of the thermistor voltage sometimes fluctuates due to not only a temperature of a battery but also an influence of the conducting current to the motor.

That is, in the overlapped part of the current path for detecting the thermistor voltage, a voltage drop occurs due to the conducting current to the motor. The detection value of the thermistor voltage may fluctuate due to the influence of the voltage drop. The temperature detected based on the detection value of such thermistor voltage shows a value different from the actual temperature of the battery.

If the detected temperature is higher than the actual battery temperature due to such error, the temperature of the battery may be erroneously determined to be high although no reduction (limitation) of the conducting current is necessary. There may be a case where the amount of the conducting current is controlled to be reduced (limited). Such control hinders a user of the motor-driven device from performing intended operation, and may deteriorate usability of the motor-driven device.

In one aspect of the present disclosure, it is desirable to be able to reduce detection error in temperature detection of a battery.

A device body in one aspect of the present disclosure comprises a motor, a current path, a positive terminal, a negative terminal, a device-side signal terminal, a temperature information detector, a current detector, and a correction unit.

The motor is driven by electric power supplied from a battery pack. The battery pack comprises a battery, a temperature detector configured to vary a resistance value thereof in accordance with temperature of the battery, a positive electrode, a negative electrode, and a battery-side signal terminal that outputs a temperature signal of which voltage value is changed in accordance with change in resistance value of the temperature detector.

The current path is configured to pass a conducting current to the motor therethrough.

The positive terminal is configured to be coupled to the positive electrode of the battery pack. The negative terminal is configured to be coupled to the negative electrode of the battery pack. An electric potential of the negative terminal is set to a reference electric potential of the current path. The device-side signal terminal is configured to be coupled to the battery-side signal terminal of the battery pack.

The temperature information detector is configured to detect temperature information indicating the temperature of the battery based on a temperature detection voltage value. The temperature detection voltage value is a voltage value of the device-side signal terminal with respect to the reference electric potential.

The current detector is configured to detect a value (current value) of the conducting current to the motor.

The correction unit is configured to correct the temperature information based on the current value so as to reduce influence given to the temperature information by the conducting current.

The device body is configured such that, when the battery pack is attached, there is an overlap at a portion including the negative terminal between the current path for acquiring the temperature detection voltage value and the current path for the conducting current to the motor. Thus, the temperature detection voltage value may vary due to not only the temperature of the battery but also the influence of the conducting current to the motor. Therefore, there is a case where the temperature information detected based on the temperature detection voltage value by the temperature information detector provides a value different from the actual temperature of the battery due to the influence of the conducting current to the motor (in other words, error occurs).

In contrast, the device body is provided with the current detector and the correction unit and corrects the temperature information based on the current value of the conducting current to the motor so as to reduce the influence given to the temperature information by the conducting current to the motor. Correction of the temperature information as such allows reduction of error between the actual temperature of the battery and the detected temperature information.

Therefore, the device body described above can suppress deterioration in detection accuracy of the battery temperature.

The device body may be configured to detachably attach a battery pack thereto and may configure a motor-driven device together with the battery pack.

In the device body, at least one of the device body and the battery pack may be provided with a temperature signal generator configured to supply one of current and voltage to the temperature detector. In other words, temperature signal may be generated using such temperature signal generator. Temperature signal may be generated using other methods.

In the device body, the correction unit may be configured to correct the temperature information such that the temperature of the battery indicated by the temperature information becomes lower as the current value of the conducting current to the motor is increased.

That is, the larger the current value of the conducting current to the motor is, the greater the influence given to the temperature information by the conducting current is. The error between the detected temperature information and the actual temperature of the battery is increased. Therefore, correction of the temperature information as mentioned above can reduce erroneous determination of the battery temperature.

The device body may further comprise a motor control unit and an abnormality determination unit.

The motor control unit is configured to drive and control the motor. The abnormality determination unit is configured to determine whether the temperature of the battery is abnormal based on the temperature information and a temperature determination reference value for determining abnormality of the battery temperature.

Since the correction unit corrects the temperature information based on the current value as described above to reduce the error between the detected temperature information and the actual temperature of the battery, the error of the temperature information used in the abnormality determination unit can be reduced. Accordingly, deterioration in abnormality determination accuracy in the abnormality determination unit (accuracy of determining whether the temperature of the battery is abnormal) can be suppressed.

Therefore, according to the device body of the present disclosure, since it is possible to suppress deterioration in detection accuracy of the battery temperature as well as deterioration in abnormality determination accuracy of the abnormality determination unit, unnecessary abnormality correction (e.g., at least one of limitation and suspension of the conducting current to the motor) can be reduced. Deterioration in usability by the user can be suppressed.

In the device body comprising the motor control unit and the abnormality determination unit, the correction unit may be configured to correct the temperature determination reference value based on the current value so as to reduce the influence given to the temperature information by the conducting current.

In other words, one of techniques for suppressing deterioration in abnormality determination accuracy of the abnormality determination unit based on the current value of the conducting current to the motor is to correct the temperature determination reference value based on the current value.

In the device body as such, the correction unit may be configured to correct the temperature determination reference value such that the temperature determination reference value becomes larger as the current value of the conducting current to the motor is increased.

That is, the larger the current value of the conducting current to the motor is, the greater the influence given to the temperature information by the conducting current is. The error between the detected temperature information and the actual temperature of the battery is increased. Therefore, the temperature determination reference value is corrected such that the temperature determination reference value becomes larger as the current value of the conducting current to the motor is increased. It is then possible to reduce erroneous determination of the battery temperature.

In the device body comprising the motor control unit and the abnormality determination unit, the motor control unit may be configured to perform at least one of reduction and suspension of the conducting current to the motor, when the temperature of the battery is determined abnormal by the abnormality determination unit.

In the device body configured as such, when the detected temperature is higher than the actual battery temperature due to the error, there is a case where at least one of reduction and suspension of the conducting current is carried out although neither is necessary, because the battery temperature is erroneously determined to be a high temperature.

In contrast, the device body of the present disclosure is provided with the current detector and the correction unit as described above. It is possible to suppress deterioration in detection accuracy of the battery temperature and deterioration in abnormality determination accuracy in the abnormality determination unit. Therefore, unnecessary processing (at least one of reduction and suspension of the conducting current to the motor) can be reduced. Deterioration in usability by the user can be thus suppressed.

In the device body, the correction unit may be configured to perform a plurality of correction methods to correct the temperature information. Each of the plurality of correction methods corresponds to a mutual different one of a plurality of current regions. The plurality of current regions correspond to a plurality of ranges that can be taken by the current value.

Thus, by defining the correction method of the temperature information for each of the plurality of current regions, it is possible to set a correction method suitable for each current region.

In the device body comprising the correction unit that executes the plurality of correction methods, the plurality of current regions may comprise 16 or fewer current regions.

In this way, complexity of the correction processing in the correction unit can be reduced. It is possible to suppress excess of the processing load.

Another aspect of the present disclosure provides a motor-driven device comprising a device body and a battery pack. The device body is configured as the device body described above.

The battery pack comprises a battery, a temperature detector configured to vary a resistance value thereof in accordance with a temperature of the battery, a positive electrode, a negative electrode, and a battery-side signal terminal configured to output a temperature signal of which voltage value is changed in accordance with change in resistance value of the temperature detector.

The motor-driven device, similar to the device body, can suppress deterioration in detection accuracy of the battery temperature. Also, if the device body comprises the motor control unit and the abnormality determination unit, the motor-driven device can suppress deterioration in abnormality determination accuracy in the abnormality determination unit, similar to the device body. Thus, unnecessary abnormality correction (e.g., at least one of limitation and suspension of the conducting current to the motor) can be reduced. Deterioration in usability by the user can be thus suppressed.

Another aspect of the present disclosure provides a method of detecting a temperature of a battery that supplies electric power to a motor. The method comprises: detecting temperature information indicating the temperature of the battery based on a temperature detection value supplied from a temperature detector; detecting a value of a conducting current to the motor; and correcting the temperature information based on the detected value so as to reduce influence given to the temperature information by the conducting current. The temperature detector is configured such that a resistance value thereof changes in accordance with the temperature of the battery. The temperature detection value changes in accordance with the resistance value.

In the method as mentioned above, the temperature information is corrected based on the current value of the conducting current to the motor, so as to reduce the influence given to the temperature information by the conducting current. Correction of the temperature information as such can reduce error between the detected temperature information and the actual temperature of the battery.

Therefore, according to the method described above, it is possible to suppress deterioration in detection accuracy of the battery temperature.

BRIEF DESCRIPTION OF THE DRAWINGS

Exemplary embodiments will now be described by way of example with reference to the accompanying drawings, in which:

FIG. 5 is an explanatory view showing a correction data table in the second embodiment;

FIG. 8 is an explanatory view showing a correction data table in the fourth embodiment.

DETAILED DESCRIPTION OF THE PREFERRED EMBODIMENTS

1. First Embodiment

[1-1. Entire Configuration]

Figure 1:
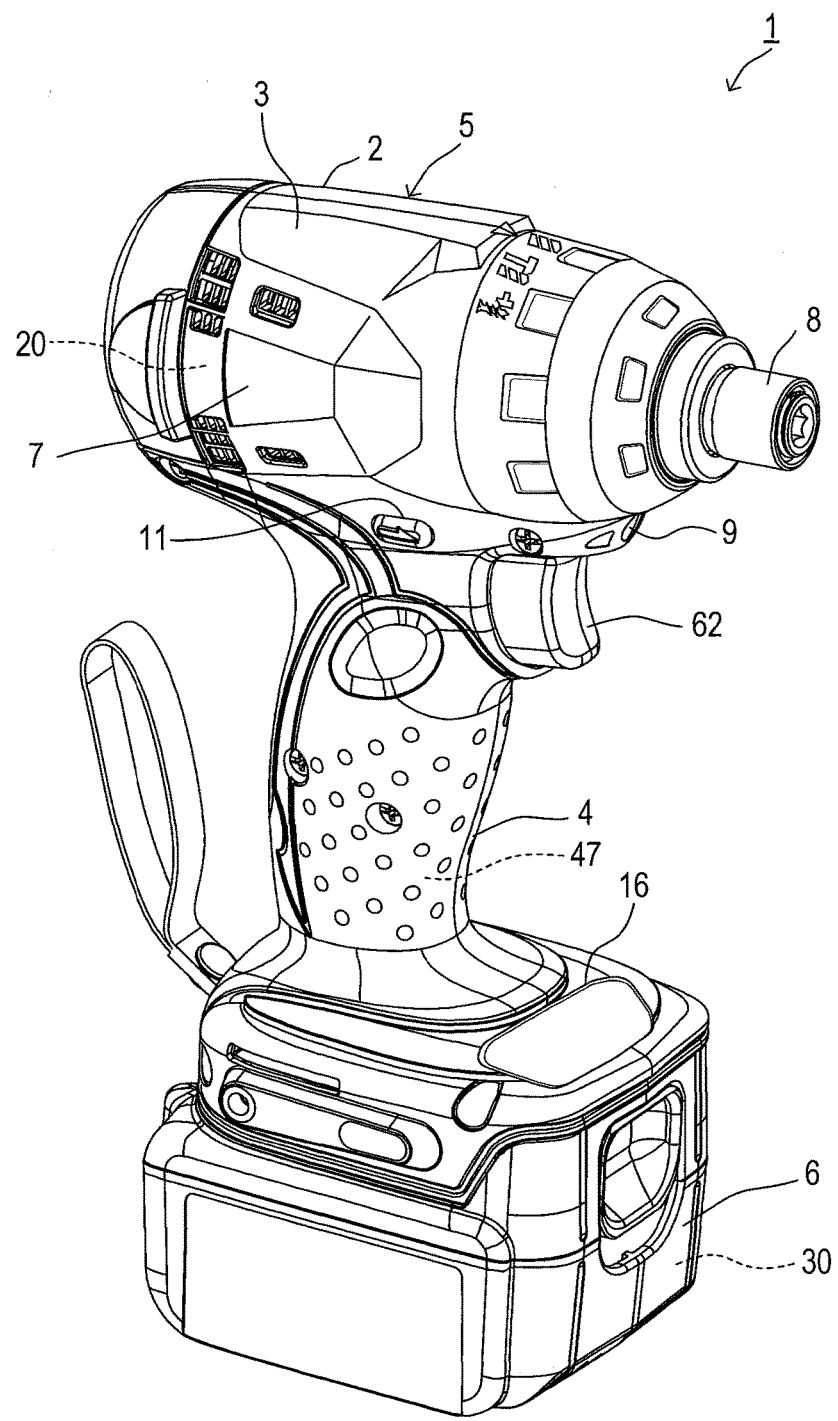
FIG. 1 is a perspective view showing an appearance of an impact driver as an electric power tool.

As shown in FIG. 1, an electric power tool 1 of the present embodiment is configured as an impact driver.

More specifically, the electric power tool 1 includes a tool body 5 and a battery pack 6 configured attachable to and detachable from the tool body 5.

The tool body 5 is formed by assembling half housings 2 and 3. The tool body 5 is provided with a handle portion 4 that extends from a lower part of the tool body 5. The battery pack 6 is detachably attached to a lower end of the handle portion 4.

A motor housing portion 7 that houses a motor 20 as a driving source of the electric power tool 1 is provided at a rear portion of the tool body 5. In front of the motor housing portion 7, a plurality of types of transmission mechanisms (not shown) are housed for transmitting rotation of the motor 20 to a tool distal end side. At a tip end of the tool body 5, a sleeve 8 for attaching a not shown tool bit (e.g. driver bit), which is an example of a tool element, projects.

A trigger switch 62 (start switch 62) is provided at an upper front side of the handle portion 4 of the tool body 5.

The trigger switch 62 is operable by a user (operator) of the electric power tool 1 holding the handle portion 4 in order to rotationally drive the motor 20 to operate the electric power tool 1. Further, at a top center portion of the handle portion 4 of the tool body 5, a forward-reverse changeover switch 11 is provided for switching a rotation direction of the motor 20.

The battery pack 6 includes a built-in battery 30 formed by coupling in series secondary battery cells that generate a predetermined DC voltage. Inside the handle portion 4, a motor control device 47 (comprising a control unit 64, a motor drive unit 65, a current detector 68, etc. to be described later; see FIG. 2) is housed that receives power supply from the battery 30 in the battery pack 6 to operate and rotates the motor 20 in accordance with an operation amount of the trigger switch 62.

The motor 20 does not start to rotate immediately after the trigger switch 62 is pulled even a little. The motor 20 does not rotate until the trigger switch 62 is pulled by a predetermined amount (although it is little) from the start of pulling. When the pulling amount exceeds a predetermined amount, the motor 20 starts to rotate. The number of revolutions (rotational speed) of the motor 20 increases in accordance with the pulling amount (for example, in proportion to the pulling amount). When the trigger switch 62 is pulled to a predetermined position (for example, fully pulled), the number of revolutions of the motor 20 reaches an upper limit that has been set.

Further, on top of the trigger switch 62 in the tool body 5, an illumination LED 9 is provided for radiating light to the front of the electric power tool 1. The illumination LED 9 lights up when the user operates the trigger switch 62.

Further, at a lower end of the handle portion 4, an operation and display panel 16 is provided for various kinds of information display and operation input reception, such as display of various set values and reception of setting change operation in the electric power tool 1, display of a remaining amount of the battery 30, etc. It should be noted that a description of a specific configuration of the operation and display panel 16 is not provided.

[1-2. Battery Pack]

A specific structure of the battery pack 6 will be described with reference to FIG. 2.

Figure 2:
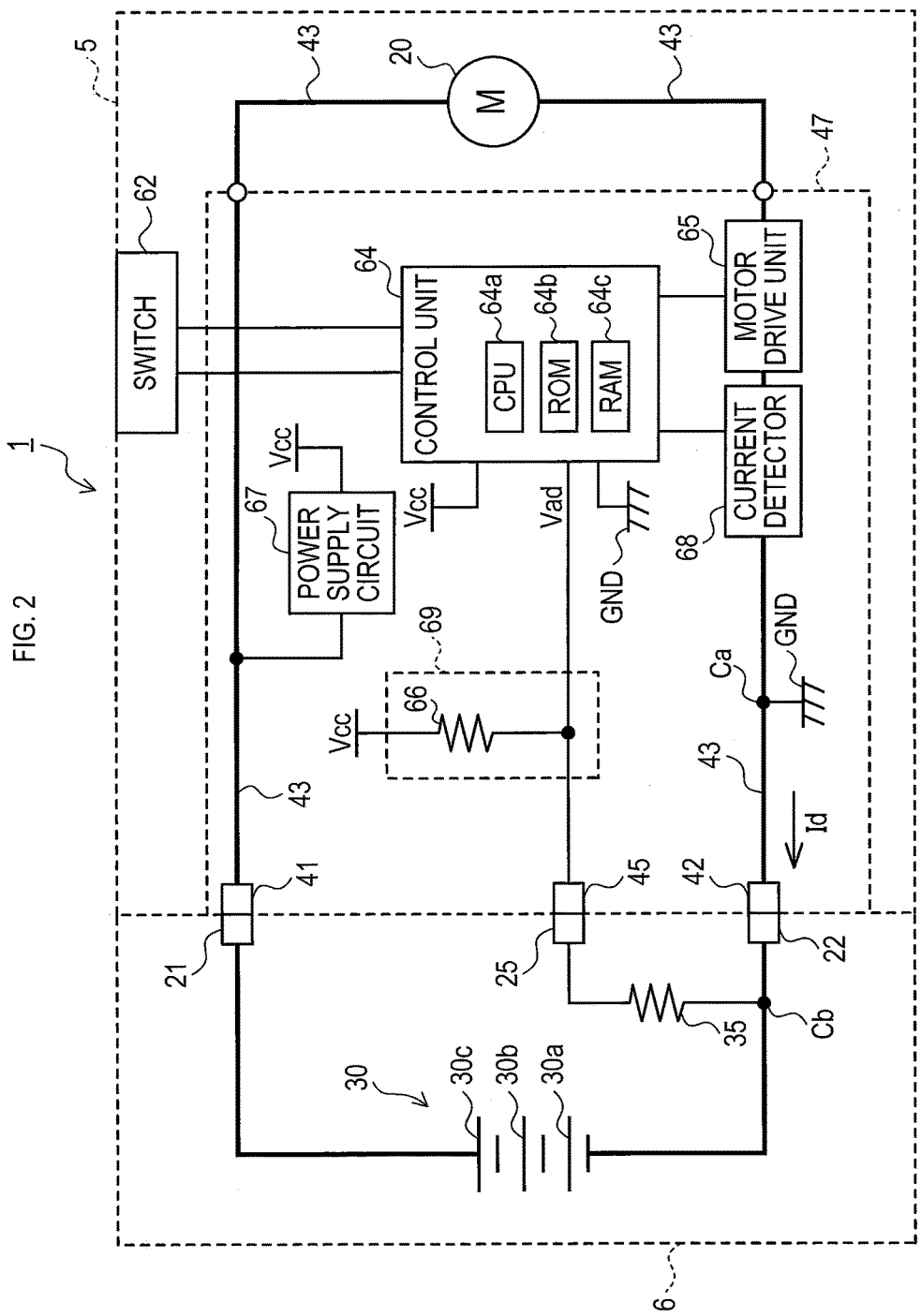
FIG. 2 is a block diagram showing an electrical configuration of a tool body and a battery pack in the electric power tool.

As shown in FIG. 2, the battery pack 6 comprises a positive terminal 21, a negative terminal 22, and a battery-side temperature signal terminal 25, as terminals electrically coupled to the tool body 5 when mounted to the tool body 5. The battery 30 is housed in the battery pack 6.

When the battery pack 6 is mounted to the tool body 5, a conducting current Id flows to the motor 20 from the battery 30 via the positive terminal 21 and the negative terminal 22. As a result, motor driving power is supplied to the electric power tool 1.

The battery 30 is configured by a plurality of series-coupled rechargeable secondary battery cells (hereinafter, simply referred to as "cells"). Specifically, in this embodiment, the battery 30 includes three cells, i.e., a first cell 30a, a second cell 30b, and a third cell 30c coupled in series.

A positive electrode of the battery 30 (i.e. positive electrode of the third cell 30c) is coupled to the positive terminal 21, and a negative electrode of the battery 30 (i.e. negative electrode of the first cell 30a) is coupled to the negative terminal 22. The battery 30 of this embodiment is a lithium ion secondary battery.

A thermistor 35 is provided inside the battery pack 6. The thermistor 35 is provided near the battery 30 (e.g. near any of the cells) for the purpose of detecting a temperature of the battery 30 (battery temperature). One end of the thermistor 35 is coupled to the negative terminal 22, and the other end is coupled to the battery-side temperature signal terminal 25.

When the battery pack 6 is mounted to the tool body 5, the battery-side temperature signal terminal 25 of the battery pack 6 is coupled to a tool-side temperature signal terminal 45 of the tool body 5. In the tool body 5, the tool-side temperature signal terminal 45 is coupled to the control unit 64 and also coupled to one end of a resistor 66 of a temperature signal generator 69. To the other end of the resistor 66, a power supply voltage Vcc having a predetermined DC voltage value is applied.

With this configuration, when the battery pack 6 is mounted to the tool body 5, a series circuit of the resistor 66 of the tool body 5 and the thermistor 35 of the battery pack 6 is formed. The power supply voltage Vcc of the tool body 5 is applied to the series circuit. Then, a divided voltage value acquired by dividing the power supply voltage Vcc by the resistor 66 and the thermistor 35, i.e. voltage between both ends of the thermistor 35, is output from the battery-side temperature signal terminal 25 of the battery pack 6 as a signal indicating the temperature of the battery 30 (hereinafter, also referred to as "battery temperature detection signal Vad"), and input to the control unit 64 via the tool-side temperature signal terminal 45 in the tool body 5. The control unit 64 of the tool body 5 may acquire and recognize the temperature of the battery 30, based on the input battery temperature detection signal Vad.

As described later, in the tool body 5, a first ground GND (reference electric potential) of a circuit through which the conducting current Id to the motor 20 flows and a second ground GND of a circuit through which current flows to the thermistor 35 are common. Therefore, a value of the battery temperature detection signal Vad recognized by the control unit 64 of the tool body 5 when the conducting current Id flows from the battery 30 to the motor 20 is not a value of only the voltage between both ends of the thermistor 35 but a value of a sum of the voltage between both ends and a voltage caused by the conducting current Id to the motor 20.

[1-3. Electric Power Tool]

As shown in FIG. 2, the electric power tool 1 comprises the battery pack 6, and the tool body 5. The battery pack 6 is detachably attached to the tool body 5. FIG. 2 shows an electrical configuration in which the battery pack 6 is mounted to the tool body 5.

The tool body 5 comprises a positive terminal 41, a negative terminal 42, and a tool-side temperature signal terminal 45. When the battery pack 6 is mounted to the tool body 5, the positive terminals 21 and 41 are electrically conducted, the negative terminals 22 and 42 are electrically conducted, and the battery-side temperature signal terminal 25 and the tool side temperature signal terminal 45 are electrically conducted, as shown in FIG. 2.

The tool body 5, as shown in FIG. 2, includes the motor 20, the trigger switch 62, the control unit 64, the motor drive unit 65, the power supply circuit 67, the current detector 68, and the temperature signal generator 69.

In a current path 43 extending from the positive terminal 41 to the negative terminal 42 via the motor 20, the motor drive unit 65 and the current detector 68 are provided downstream of the motor 20. The trigger switch 62 is a switch operated by the user of the electric power tool 1.

The power supply circuit 67, when the battery voltage from the battery 30 is input, outputs a voltage acquired by stepping down the battery voltage to the power supply voltage Vcc having a predetermined voltage value. The power supply voltage Vcc generated in the power supply circuit 67 is used as a power supply for operating each portion of the tool body 5, which includes the control unit 64 and the temperature signal generator 69.

The control unit 64 detects an operation state of the trigger switch 62, and determines a command of the user based on the detection result. The current detector 68 detects the current Id flowing from the positive terminal 21 to the negative terminal 22 via the motor 20, and outputs a signal indicating a current value of the current Id to the control unit 64.

The temperature signal generator 69 comprises the resistor 66. One end of the resistor 66 is coupled to a control power source line to which the power source voltage Vcc is supplied. The power supply voltage Vcc is applied to the one end of the resistor 66. The other end of the resistor 66 is coupled to the tool-side temperature signal terminal 45. In a state where the battery pack 6 is mounted to the tool body 5, the other end of the resistor 66 is coupled to one end of the thermistor 35 via the tool-side temperature signal terminal 45 and the battery-side temperature signal terminal 25 of the battery pack 6.

That is, the temperature signal generator 69 is configured to supply current or apply voltage to the thermistor 35. As a result of the current supply or voltage application to the thermistor 35 by the temperature signal generator 69, a divided value acquired by dividing the power supply voltage Vcc by the resistors 66 and the thermistor 35, i.e. the voltage between both ends of the thermistor 35, is generated as a signal (battery temperature detection signal Vad) indicating the temperature of the battery 30.

With this configuration, the battery temperature detection signal Vad is input to the tool-side temperature signal terminal 45 of the tool body 5 from the thermistor 35 of the battery pack 6 via the battery-side temperature signal terminal 25. Then, the battery temperature detection signal Vad input to the tool side temperature signal terminal 45 is input to the control unit 64.

A filter circuit, etc. may be provided on a signal path from the tool-side temperature signal terminal 45 to the control unit 64 to remove noise components (e.g. high-frequency components having a predetermined frequency or more) from the battery temperature detection signal Vad. Alternatively, the control unit 64 may be configured to perform a filtering process to remove noise components (e.g. high-frequency components having a predetermined frequency or more) from the battery temperature detection signal Vad as a digital signal after A/D conversion of the battery temperature detection signal Vad input from the tool side temperature signal terminal 45.

The control unit 64, in the first embodiment, is a microcomputer comprising a CPU 64a, a ROM 64b, a RAM 64c, I/O and so on. The control unit 64 may be constructed by combining individual electronic parts, may be an ASIC (Application Specific Integrated Circuit), a programmable logic device such as, for example, a FPGA (Field Programmable Gate Array), or a combination thereof. The control unit 64, when detecting that the trigger switch 62 is turned on, outputs a drive command to the motor drive unit 65 to rotate the motor 20 at a target rotation speed corresponding to the operation amount of the trigger switch 62. The drive command, in this embodiment, is a command indicating a duty ratio.

The motor drive unit 65, when the drive command is input from the control unit 64, turns on or off a switch (not shown) at a duty ratio indicated by the drive command to flow or interrupt the current Id to the motor 20, thereby to drive the motor 20.

The motor 20 in the present embodiment is a brush DC motor, but this is merely an example. Further, the switch provided in the motor drive unit 65 in the present embodiment is an N-channel MOSFET, but this is also merely an example.

When the motor 20 rotates, the tool element (sleeve 8; see FIG. 1) is operated by the rotational driving force. Thereby, a function as an electric power tool is exerted. When the trigger switch 62 is turned off, the control unit 64 stops outputting the drive command. Then, the motor drive unit 65 turns off the switch to interrupt the current Id, thereby to stop the motor 20.

In other words, the control unit 64, when the battery pack 6 is mounted to the tool body 5, executes a motor control process for driving and controlling the motor 20 in accordance with the operation state of the trigger switch 62 by the user.

Further, in the motor control process, whether the temperature of the battery 30 is abnormal is determined using a battery temperature T1 detected based on the battery temperature detection signal Vad. The determination result is utilized for drive control of the motor 20. Specifically, when the battery temperature T1 is out of a predetermined temperature determination reference range (specifically, a temperature range larger than a low temperature side threshold Ta and smaller than a high temperature side threshold Tb to be described later), it is determined that the temperature of the battery 30 is abnormal. Even if the trigger switch 62 be turned on, the motor drive unit 65 is controlled to forcibly stop the current supply to the motor 20.

Note that the process details of the motor control process will be described later.

[1-4. Relationship Between Temperature Signal and Conducting Current]

In the tool body 5, a battery temperature detection signal Vad input from the tool-side temperature signal terminal 45 is an analog signal. The control unit 64 executes various types of processing including the motor control process, on the basis of various analog signals including the battery temperature detection signal Vad. That is, the control unit 64 detects a voltage value referenced to the ground GND for each analog signal, and performs various processing based on the detection value.

Here, the ground GND referenced by the control unit 64 to process each analog signal is the same as the ground GND of the current detector 68 for detecting the value (current value Im) of the conducting current Id to the motor 20. That is, the ground GND for detecting the conducting current Id to the motor 20 and the ground GND for the analog signal processing are common.

Therefore, the analog signal input to the control unit 64 when the current Id flows from the battery 30 to the motor 20 includes an error caused by the common ground GND.

Specifically, when the battery pack 6 is mounted to the tool body 5, a current path is formed that extends from the power supply circuit 67 of the tool body 5 via the resistance 66 of the temperature signal generator 69, the tool-side temperature signal terminal 45, the battery-side temperature signal terminal 25 of the battery pack 6, the thermistor 35, the negative terminal 22 of the battery pack 6, the negative terminal 42 of the tool body 5, and the ground GND, to the power supply circuit 67. The current path is a path for generating the battery temperature detection signal Vad.

The ground GND of the current path is common to the ground GND for the conducting current to the motor 20. Therefore, when the current Id flows from the battery 30 to the motor 20, not only the current based on the power supply voltage Vcc from the power supply circuit 67, but also the current Id from the battery 30 to the motor 20 flows through part (section from a point Ca up to a point Cb through the negative terminal 42 and the negative terminal 22) of the current path.

That is, while the electric power is supplied to the motor 20, the value of the battery temperature detection signal Vad detected by the control unit 64 with reference to the ground GND (value of the battery temperature detection signal Vad input from the tool-side temperature signal terminal 45) is not a pure voltage between both ends of the thermistor 35, but a value acquired by adding a voltage between both ends of the above section (in other words, the voltage drop in the above section caused by the conducting current Id to the motor 20) to the voltage between both ends of the thermistor 35. Therefore, the battery temperature T1 acquired based on the battery temperature detection signal Vad includes an error caused by the conducting current Id to the motor 20.

Therefore, if the temperature of the battery 30 is determined based on the battery temperature T1 that contains an error as such, it is possible that erroneous determination occurs. For example, in the motor control process, there is a risk that the battery temperature is determined abnormal (for example, the battery temperature is high or low) although it is not in fact abnormal (for example, the battery temperature is normal), or is determined normal although the battery temperature is in fact abnormal.

Therefore, the motor control process of the present embodiment is configured to correct a method to determine whether the temperature of the battery 30 is abnormal based on the battery temperature T1 detected by using the battery temperature detection signal Vad, based on the current value of the current Id. Specifically, in order to reduce the amount of variation in the battery temperature detection signal Vad (or battery temperature T1) due to the influence of the conducting current Id to the motor 20, the method of determining the temperature abnormality in battery 30 is corrected based on the current value of the conducting current Id to the motor 20.

Various measures may be taken to correct the determination method. In this embodiment, correction of the battery temperature T1 detected using the battery temperature detection signal Vad based on the current value of the conducting current Id to the motor 20 is employed.

[1-5. Motor Control Process]

Figure 3:
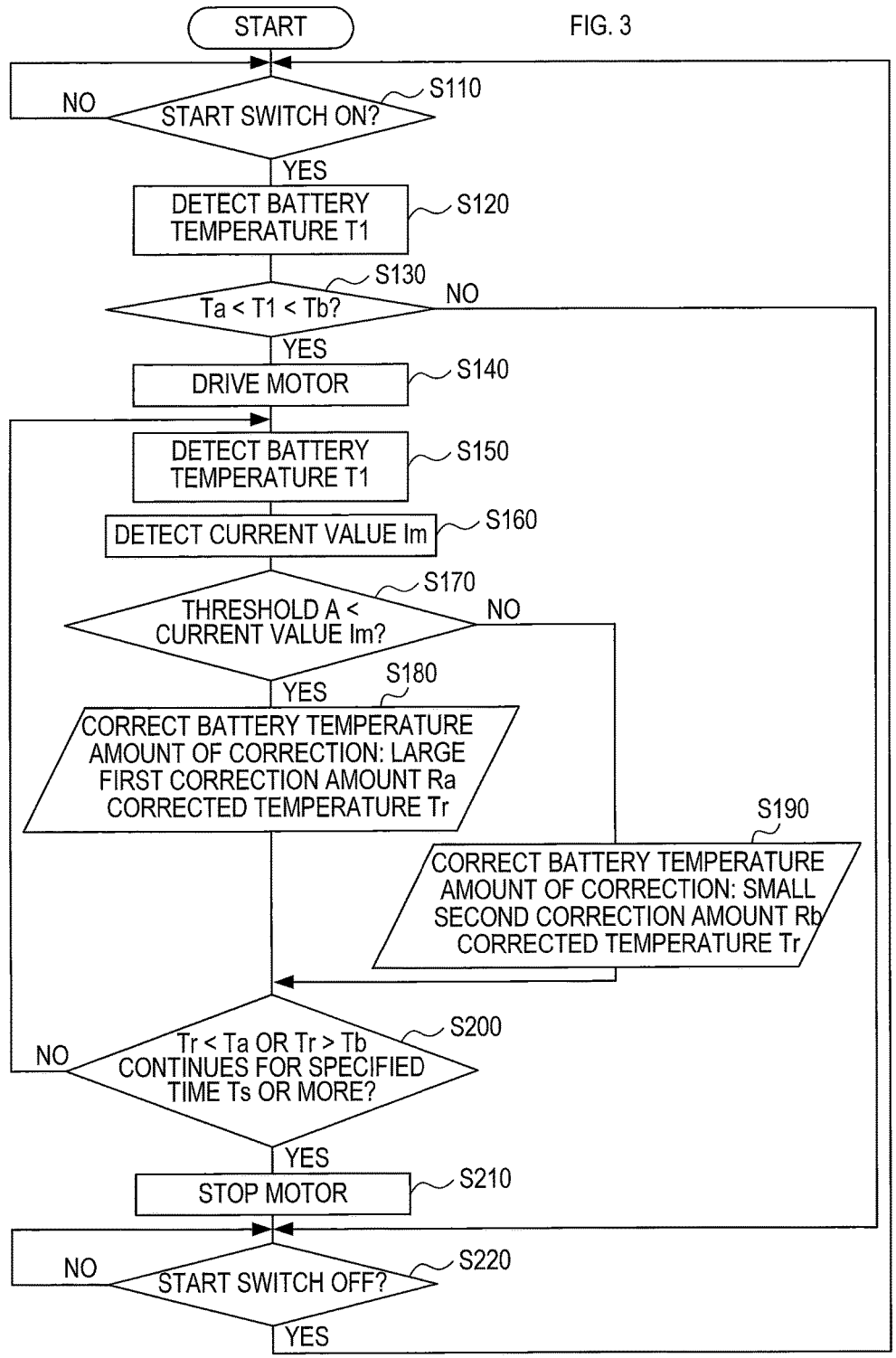
FIG. 3 is a flowchart showing process details of a motor control process in a first embodiment.

Next, a description will be given on the motor control process performed by the control unit 64 of the electric power tool 1 (tool body 5). FIG. 3 is a flowchart showing process details of the motor control process.

The control unit 64 of the tool body 5, when detecting that the battery pack 6 is mounted to the tool body 5, starts the motor control process. Specifically, the CPU 64a of the control unit 64 reads and executes a program of the motor control process which is stored in at least one of the ROM 64b and RAM 64c.

When the motor control process is started, it is first determined in S110 (S denotes a step) whether the trigger switch 62 (start switch 62) is turned on. If affirmative determination is made in S110, the process proceeds to S120. If negative determination is made, the process repeatedly runs the same step to stand by.

In S120, the battery temperature T1 is detected. Specifically, a resistance value of the thermistor 35 is calculated on the basis of the resistance value of the resistor 66, the voltage value of the power supply voltage Vcc and the voltage value of the battery temperature detection signal Vad. Further, the temperature of the thermistor 35 is calculated on the basis of the resistance value of the calculation result and the "resistance value-temperature characteristics of the thermistor 35", to set the calculation result as the battery temperature T1 of the battery 30.

In subsequent S130, it is determined whether the battery temperature T1 detected in S120 is in a temperature range greater than the predetermined low temperature side threshold Ta and smaller than the predetermined high temperature side threshold Tb. The process moves to S140 if affirmative determination is made in S130, and the process proceeds to S220 if negative determination is made. In this embodiment, the low temperature side threshold Ta is set to "−30° C.", and the high temperature side threshold Tb is set to "70° C.".

A process of driving the motor 20 is executed in S140. Specifically, in order to rotate the motor 20 at a target rotation speed corresponding to the operation amount of the trigger switch 62, a drive command corresponding to the target speed is output to the motor drive unit 65. The drive command, in this embodiment, is a command indicating a duty ratio.

The motor drive unit 65, when the drive command is input from the control unit 64, turns on and off the switch (not shown) at the duty ratio indicated by the drive command to flow or interrupt the current Id to the motor 20, thereby to drive the motor 20.

In subsequent S150, the battery temperature T1 is detected, in the same calculation method as in S120. Thus, the latest battery temperature T1 is detected.

In subsequent S160, the current value Im of the conducting current Id to the motor 20 is detected. Specifically, the current value Im of the conducting current Id to the motor 20 is detected based on a signal from the current detector 68.

In subsequent S170, comparison is made between the current value Im detected in S160 and a predetermined current determination threshold A. It is then determined whether the current value Im is larger than the current determination threshold A. The process moves to S180 if affirmative determination is made in S170, and the process proceeds to S190 if negative determination is made. In the present embodiment, "30 [A]" is set to the current determination threshold A.

In S180, the battery temperature T1 detected in S150 is corrected using a first correction amount Ra. More specifically, a value acquired by subtracting the first correction amount Ra from the battery temperature T1 is set as a corrected temperature Tr (=T1−Ra). The first correction amount Ra is a correction amount used when a large correction is made. In the present embodiment, "15° C." is set to the first correction amount Ra.

In S190, the battery temperature T1 detected in S150 is corrected using a second correction amount Rb. More specifically, a value acquired by subtracting the second correction amount Rb from the battery temperature T1 is set as the corrected temperature Tr (=T1−Rb). The second correction amount Rb is a correction amount used when a small correction is made. In the present embodiment, "10° C." is set to the second correction amount Rb.

That is, the first correction amount Ra used when a large correction is made is set greater than the second correction amount Rb used when a small correction is made.

After completion of S180 or S190, the process moves to S200. In S200, it is determined whether a "state in which the corrected temperature Tr is lower than the low temperature side threshold Ta" or "a state in which the corrected temperature Tr is higher than the high temperature side threshold Tb" is continuous for a predetermined specified time Ts or more. The process proceeds to S210 if affirmative determination is made in S200, and the process proceeds to S150 again if negative determination is made.

That is, in S200, it is determined whether the temperature abnormal state (Tr<Ta or Tr>Tb) of the battery 30 has continued for the specified time Ts or more. In this embodiment, 0.5 [sec] is set to the specified time Ts.

In S210, a process of stopping the motor 20 is performed. Specifically, the output of the drive command to the motor drive unit 65 is stopped, or a stop command is output to the motor drive unit 65.

When negative determination is made in S130 or when S210 is completed, the process proceeds to S220. In S220, it is determined whether the trigger switch 62 (start switch 62) is turned off. When affirmative determination is made, the process moves to S110 again. When negative determination is made, the process repeatedly executes the same step to stand by.

In the motor control process configured as such, upon determining whether the temperature of the battery 30 is abnormal (S200), not the battery temperature T1 detected using the battery temperature detection signal Vad but the corrected temperature Tr acquired by correcting the battery temperature T1 based on the current value Im is used.

As a result, the determination method for temperature abnormality in the battery 30 can be corrected so as to reduce the amount of variation in the battery temperature detection signal Vad (or the battery temperature T1) due to the influence of the conducting current Id to the motor 20. As compared with the case of using the battery temperature T1 before corrected, determination accuracy of the temperature abnormality in the battery 30 can be improved.

Upon correcting the battery temperature T1, if the current value Im is greater than the current determination threshold A, the battery temperature T1 is corrected using the first correction amount Ra having a large correction amount. If the current value Im is smaller than the current determination threshold A, the battery temperature T1 is corrected using the second correction amount Rb having a smaller correction amount than the first correction amount Ra.

Thus, the battery temperature T1 can be corrected using an appropriate correction amount corresponding to the magnitude of the conducting current Id to the motor 20. Use the corrected temperature Tr can further improve determination accuracy of the temperature abnormality in the battery 30.

[1-6. Effect]

As described above, in the electric power tool 1 of the present embodiment, there is an overlap between the current path for acquiring an analog value (in other words, a voltage value generated in the tool-side temperature signal terminal 45 with the ground GND as a reference electric potential) of the temperature signal (battery temperature detection signal Vad) and the current path 43 of the conducting current Id to the motor 20, at some part of the current paths including the negative terminal 42, in the state where the battery pack 6 is mounted to the tool body 5. Specifically, the "section from the point Ca up to the point Cb through the negative terminal 42 and the negative terminal 22" in FIG. 2 corresponds to the overlapping portion.

Thus, the analog value of the temperature signal (battery temperature detection signal Vad) may vary due to not only the temperature of the battery 30 but the influence of the conducting current Id to the motor 20. Accordingly, there is in a state where the temperature information (battery temperature T1) detected based on the analog value of the temperature signal (the battery temperature detection signal Vad) in S120 and S150 in the motor control process may be a value different from the actual temperature of the battery 30 (in other words, an error occurs).

In contrast, the electric power tool 1 (tool body 5) comprises the current detector 68 and control unit 64 (specifically, the control unit 64 that performs S170 to S190 in the motor control process). To reduce the amount of variation of the battery temperature T1 due to the influence of the conducting current Id to the motor 20, the determination method of temperature abnormality in the battery 30 is corrected based on the current value Im of the conducting current Id to the motor 20.

More specifically, the battery temperature T1 is corrected based on the current value Im of the conducting current Id to the motor 20 to acquire the corrected temperature Tr (S170, S180, S190). Then, in the process of determining whether the temperature of the battery 30 is abnormal (S200), temperature abnormality of the battery 30 is determined not using the battery temperature T1 before corrected but the corrected temperature Tr. In other words, the method of determining whether the temperature of the battery 30 is abnormal is corrected from the determination method using the battery temperature T1 before corrected to the determination method using the corrected temperature Tr.

Thus, correction of the method of determining whether the temperature of the battery 30 is abnormal can reduce the error between the detected temperature information (battery temperature T1) and the actual temperature of the battery 30. This can also suppress deterioration in abnormality determination accuracy in the process (S200) of determining whether the temperature of the battery 30 is abnormal.

Therefore, according to the electric power tool 1 (tool body 5), it is possible to suppress deterioration in detection accuracy of the battery temperature T1, and deterioration in abnormality determination accuracy in the process (S200) of determining whether the processing temperature of the battery 30 is abnormal. Thus, unnecessary abnormality correction (motor stop process in S210) can be reduced. Degradation of usability by the user can be suppressed.

In the electric power tool 1 (tool body 5), the battery temperature T1 is corrected in S170 to S190 of the motor control process so as to decrease the corrected temperature Tr as the current value Im of the conducting current Id to the motor 20 is increased.

That is, the greater the current value Im of the conducting current Id to the motor 20 is, the greater the amount of variation of battery temperature T1 is due to the current Id. The error between the detected battery temperature T1 and the actual temperature of the battery 30 increases. Therefore, the battery temperature T1 is corrected such that the corrected temperature Tr is reduced in accordance with the increase of the current value Im of the conducting current Id to the motor 20. Thereby, it is possible to reduce erroneous determination of the battery temperature.

In the electric power tool 1 (tool body 5), the motor control process is configured to stop the conducting current Id to the motor 20 to stop driving of the motor 20 (S210), when the temperature of the battery 30 is determined abnormal in S200 (affirmative determination in S200).

In the electric power tool 1 having such a configuration, when the detected battery temperature T1 is higher than the actual battery temperature due to the influence of the error, there is a case where the battery 30 temperature is erroneously determined to be high, and the conducting current Id to the motor 20 is stopped despite the condition unnecessary to stop the conducting current Id.

In contrast, the electric power tool 1, as described above, comprises the current detector 68 and control unit 64 (specifically, the control unit 64 that performs S160 to S190 in the motor control process). Deterioration in detection accuracy of the battery temperature T1 can be suppressed. Also, deterioration in temperature abnormality determination accuracy in the battery 30 can be suppressed. Therefore, it is possible to reduce interruption of the conducting current Id to the motor 20 at unnecessary timings. Degradation in usability by the user can be suppressed.

In the present embodiment, the electric power tool 1 corresponds to an example of a motor-driven device of the present disclosure, the tool body 5 corresponds to an example of a device body of the present disclosure, the battery pack 6 corresponds to an example of a battery pack of the present disclosure, the motor 20 corresponds to an example of a motor of the present disclosure, the positive terminal 41 corresponds to an example of a positive terminal of the present disclosure, a negative terminal 42 corresponds to an example of a negative terminal of the present disclosure, and the tool-side temperature signal terminal 45 corresponds to an example of a device-side signal terminal of the present disclosure.

The temperature signal generator 69 corresponds to an example of a temperature signal generator of the present disclosure, and the control unit 64 that executes the motor control process and the motor drive unit 65 correspond to an example of a motor control unit of the present disclosure.

The control unit 64 executing the S120 and S150 of the motor control process corresponds to an example of temperature information detector of the present disclosure. The analog value (i.e., voltage generated in the tool-side temperature signal terminal 45 with the ground GND as a reference electric potential) of the temperature signal (battery temperature detection signal Vad) corresponds to an example of a temperature detection voltage of the present disclosure. The battery temperature T1 corresponds to an example of temperature information of the present disclosure, the low temperature side threshold Ta and the high temperature side threshold Tb each correspond to an example of a temperature determination reference value of the present disclosure, and the control unit 64 executing S200 of the motor control process corresponds to an example of an abnormality determination unit of the present disclosure.

The current detector 68 and the control unit 64 executing S160 in the motor control process correspond to an example of a current detector of the present disclosure, and the control unit 64 executing S170 to S190 of the motor control process corresponds to an example of a correction unit of the present disclosure.

The battery 30 corresponds to an example of a battery of the present disclosure, the thermistor 35 corresponds to an example of a temperature detector of the present disclosure, the battery-side temperature signal terminal 25 corresponds to an example of a battery-side signal terminal of the present disclosure, and the battery temperature detection signal Vad corresponds to an example of a temperature signal of the present disclosure.

2. Second Embodiment

An electric power tool of a second embodiment will be described. The electric power tool calculates a detected deviation value Er using the current value Im of the conducting current Id to the motor 20, and corrects the battery temperature T1 using the detected deviation value Er.

The electric power tool of the second embodiment is different from the electric power tool 1 of the first embodiment in part of the process details of the motor control process, but is identical in other configurations. Therefore, the following description will be mainly given on the part different from the first embodiment, and the description of the same components denoted by the same reference numerals as those in the first embodiment will no longer be repeated.

[2-1. Motor Control Process of Second Embodiment]

Figure 4:
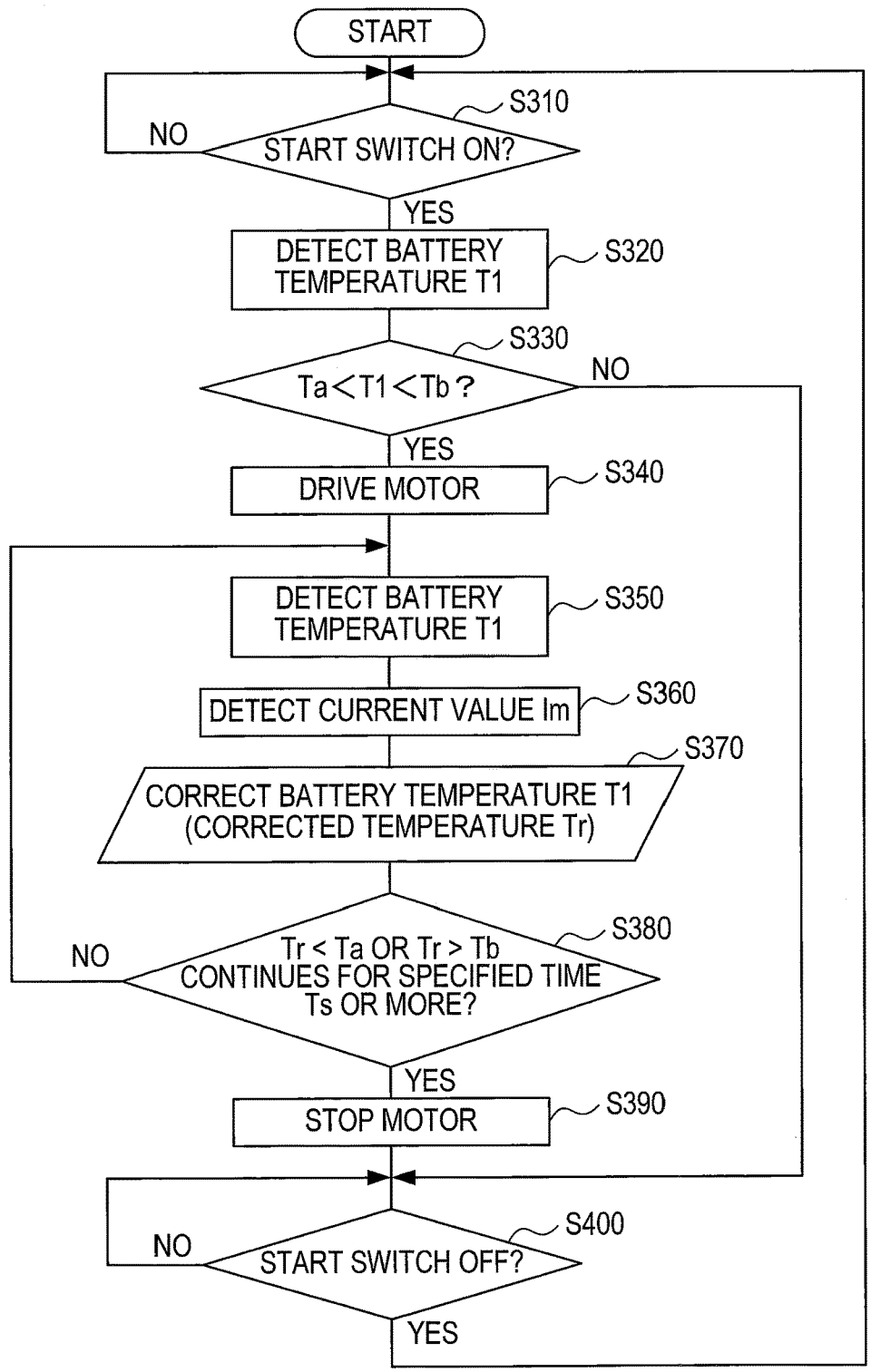
FIG. 4 is a flowchart showing process details of a motor control process in a second embodiment.

The motor control process executed by the control unit 64 of the electric power tool 1 (tool body 5) of the second embodiment will be explained. FIG. 4 is a flowchart showing process details of the motor control process in the second embodiment.

The process details in each step of S310 to S360 in the motor control process of the second embodiment are the same as those in each step of S110 to S160 in the motor control process of the first embodiment, and thus the description thereof is not repeated.

In S370 executed after S360, the detected deviation value Er is calculated using the current value Im detected in S360. The battery temperature T1 is corrected using the detected deviation value Er to calculate the corrected temperature Tr.

Specifically, the detected deviation value Er [mV] is calculated using Expression [1]. The corrected temperature Tr is calculated using a correction data table shown in FIG. 5

$$Er = Voff \times \frac{R1}{R1 + R2} \quad \text{Expression [1]}$$
$$= Im \times Rr \times \frac{R1}{R1 + R2}$$

Here, Voff is a voltage between both ends of the "section from the point Ca up to the point Cb through the negative terminal 42 and the negative terminal 22" in FIG. 2, Rr is an electric resistance value of the "section from the point Ca up to the point Cb through the negative terminal 42 and the negative terminal 22" in FIG. 2, R1 is a resistance value of the resistor 66, and R2 is a resistance value of the thermistor 35. Note that the resistance value of the thermistor 35 which is calculated in the course of calculation of the battery temperature T1 in S350 (resistance value of the thermistor 35 calculated based on the resistance value of the resistor 66, the voltage value of the power supply voltage Vcc and the voltage value of the battery temperature detection signal Vad) is set to the resistance value R2. That is, the resistance value R2 is not a predetermined fixed value but is a value that varies according to the voltage value of the battery temperature detection signal Vad.

Here, when the conducting current Id is not flowing to the motor 20, a relational expression shown in [Expression 2] is established between the power supply voltage Vcc and the battery temperature detection signal Vad (in particular, the voltage between both ends of the thermistor 35).

$$Vad = Vcc \times \frac{R2}{R1 + R2} \quad \text{[Expression 2]}$$

On the other hand, when the conducting current Id is flowing to the motor 20, a relational expression shown at the top of [Expression 3] is established among the power supply voltage Vcc, the battery temperature detection signal Vad (specifically, the voltage between both ends of the thermistor 35), and the voltage Voff between both ends.

$$Vad = (Vcc + Voff) \times \frac{R2 + Rr}{R1 + R2 + Rr} - Voff \quad \text{[Expression 3]}$$
$$= (Vcc + Voff) \times \frac{R2}{R1 + R2} - Voff$$
$$= Vcc \times \frac{R2}{R1 + R2} - Voff \times \frac{R1}{R1 + R2}$$

The electric resistance value Rr is sufficiently smaller than the resistance value R1 of the resistor 66 and the resistance value R2 of the thermistor 35, and thus can be converted into an expression shown in the second row of [Expression 3].

Here, since "Vcc×(R2/(R1+R2))" which is the first term of the bottom of [Expression 3] is equal to the right side of [Expression 2], this value corresponds to the voltage Vad between both ends of the thermistor 35. Thus, "Voff×(R1/(R1+R2))" which is the second term in the bottom row of [Expression 3] corresponds to the voltage drop in the "section from the point Ca to the point Cb through the negative terminal 42 and the negative terminal 22" in FIG. 2 and corresponds to the detected deviation value Er.

For these reasons, [Expression 1] is derived as a formula for the detected deviation value Er.

The corrected temperature Tr corresponding to the battery temperature T1 and the detected deviation value Er is calculated using the correction data table shown in FIG. 5. Specifically, a numerical value recorded in a column of which vertical axis corresponds to the battery temperature T1 detected in S350 and horizontal axis corresponds to the detected deviation value Er acquired in [Expression 1] is set as the corrected temperature Tr.

The correction data table of the present embodiment is comprised of records of the corrected temperatures per 1° C. with respect to the battery temperature T1.

When S370 is completed, the process shifts to S380.

Since the process details in each step of S380 to S400 in the motor control process of the second embodiment are the same as those in each step of S200 to S220 in the motor control process of the first embodiment, the description thereof is not repeated.

In the motor control process configured as such, upon determining whether the temperature of the battery 30 is abnormal (S380), not the battery temperature T1 detected using the battery temperature detection signal Vad but the corrected temperature Tr acquired by correcting the battery temperature T1 based on the current value Im is used.

As a result, the determination method of temperature abnormality in the battery 30 can be corrected so as to reduce the amount of variation of the battery temperature detection signal Vad (or battery temperature T1) due to the influence of the conducting current Id to the motor 20. As compared with the case of using the battery temperature T1 before corrected, determination accuracy of the temperature abnormality in the battery 30 can be improved.

Upon correcting the battery temperature T1, the detected deviation value Er is first calculated using the current value Im of the conducting current Id to the motor 20, and then the battery temperature T1 is corrected using the detected deviation value Er and the correction data table (FIG. 5) to calculate the corrected temperature Tr.

Thus, the battery temperature T1 can be corrected using an appropriate correction amount corresponding to the magnitude of the conducting current Id to the motor 20. Use of the corrected temperature Tr can further improve determination accuracy of the temperature abnormality in the battery 30.

[2-2. Effect]

As described above, the electric power tool 1 (tool body 5) of the second embodiment comprises the current detector 68 and the control unit 64 (in particular, the control unit 64 that executes S360 to S370 in the motor control process), and corrects the determination method of temperature abnormality in the battery 30 based on the current value Im of the conducting current Id to the motor 20, so as to reduce the amount of variation of the battery temperature T1 due to the influence of the conducting current Id to the motor 20.

Specifically, the detected deviation value Er is calculated based on the current value Im of the conducting current Id to the motor 20. Then, the battery temperature T1 is corrected on the basis of the detected deviation value Er to acquire the corrected temperature Tr.

Then, in the process of determining whether the temperature of the battery 30 is abnormal (S380), temperature abnormality of the battery 30 is determined using not the battery temperature T1 before corrected, but the corrected temperature Tr. In other words, the method of determining whether the temperature of the battery 30 is abnormal is corrected from the determination method using the battery temperature T1 before corrected to the determination method using the corrected temperature Tr.

Thus, correction of the method of determining whether the temperature of the battery 30 is abnormal can reduce the error between the detected temperature information (battery temperature T1) and the actual temperature of the battery 30. This also can suppress deterioration in abnormality determination accuracy in the process of determining whether the temperature of the battery 30 is abnormal (S380).

Therefore, according to the electric power tool 1 (tool body 5) of the second embodiment, it is possible to suppress deterioration in detection accuracy of the battery temperature T1, and to suppress deterioration in abnormality determination accuracy in the process of determining whether the temperature of the battery 30 is abnormal (S380). Thus, unnecessary abnormality correction (motor stop process in S390) can be reduced. Degradation in usability by the user can be suppressed.

The electric power tool 1 of the second embodiment (tool body 5), in S370 of the motor control process, corrects the battery temperature T1 to lower the corrected temperature Tr as the current value Im of the conducting current Id to the motor 20 increases (see the correction data table in FIG. 5).

That is, the larger the current value Im of the conducting current Id to the motor 20, the larger the amount of variation of the battery temperature T1 due to the influence of the conducting current Id. The error between the detected battery temperature T1 and the actual temperature of the battery 30 increases. Therefore, correcting the battery temperature T1 to reduce the corrected temperature Tr in accordance with the current value Im of the conducting current Id to the motor 20 can reduce erroneous determination of the battery temperature.

The control unit 64 executing S320 and S350 in the motor control process corresponds to an example of the temperature information detector of the present disclosure, and the control unit 64 executing S380 in the motor control process corresponds to an example of the abnormality determination unit of the present disclosure.

The current detector 68 and the control unit 64 executing S360 of the motor control process correspond to an example of the current detector of the present disclosure, and the control unit 64 executing S370 of the motor control process corresponds to an example of the correction unit of the present disclosure.

3. Third Embodiment

An electric power tool of a third embodiment will be described which compares the current value Im of the conducting current Id to the motor 20 with the predetermined current determination threshold A, and corrects the temperature determination reference values (low temperature side threshold Ta and the high temperature side threshold Tb) based on the comparison result.

The electric power tool of the third embodiment is different from the electric power tool 1 of the first embodiment in part of the process details of the motor control process, and is identical in other configurations. Therefore, the following description will be mainly given on the different part from the first embodiment, and the description of the same components denoted by the same reference numerals as in the first embodiment will not be repeated.

[3-1. Motor Control Process of the Third Embodiment]

Figure 6:
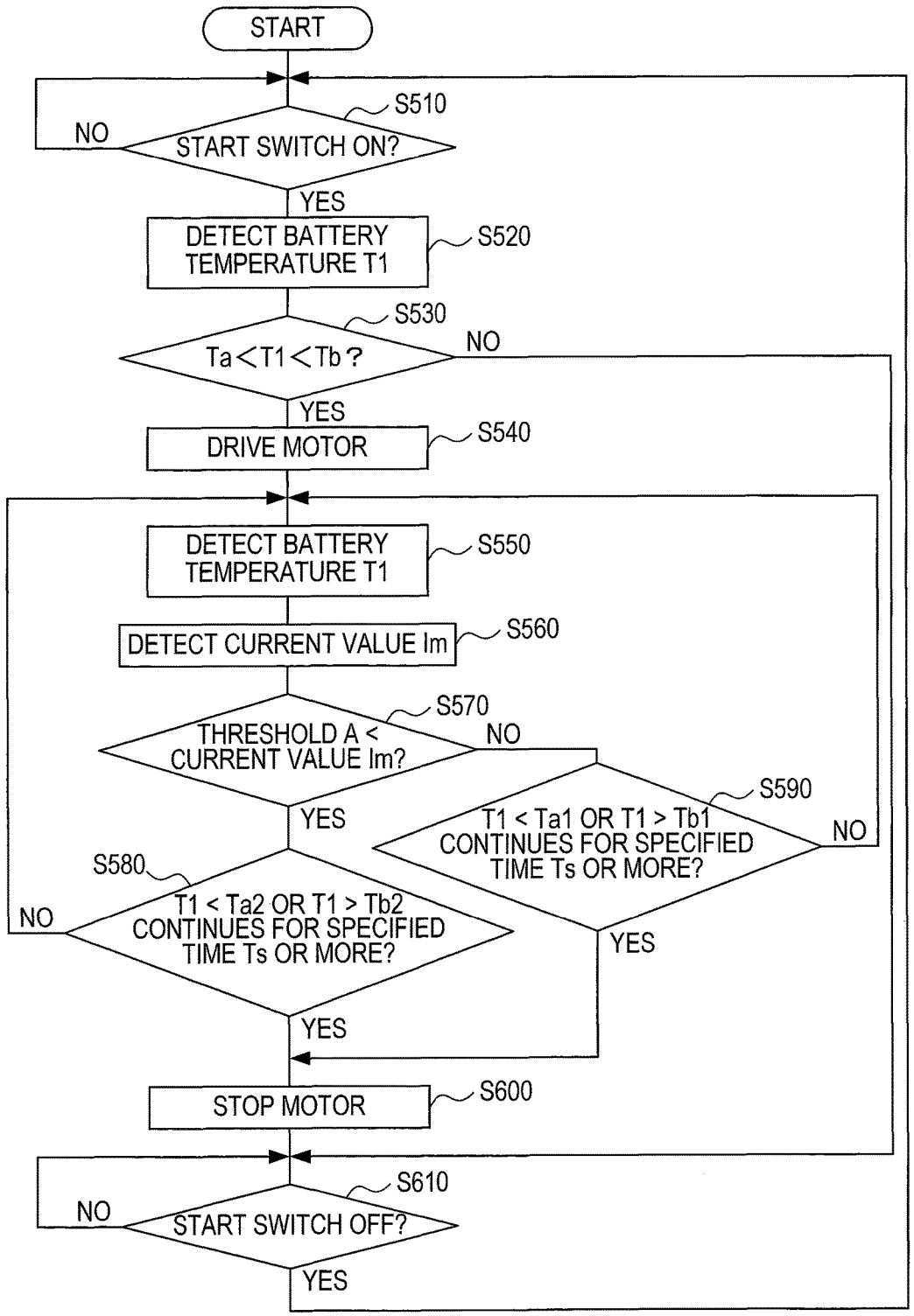
FIG. 6 is a flowchart showing process details of a motor control process in a third embodiment.

A motor control process executed by the control unit 64 of the electric power tool 1 (tool body 5) of the third embodiment will be explained. FIG. 6 is a flowchart showing the process details of the motor control process in the third embodiment.

Since the process details at each step of S510 to S560 in the motor control process of the third embodiment are the same as those in each step of S110 to S160 in the motor control process of the first embodiment, and thus the description is not repeated.

In S570 to be executed after S560, the current value Im detected in S560 and the predetermined current determination threshold A are compared to determine whether the current value Im is larger than the current determination threshold A. If affirmative determination is made, the process moves to S580. If negative determination is made, the process proceeds to S590. In the present embodiment, "30 [A]" is set to the current determination threshold A.

In S580, it is determined whether a "state in which the battery temperature T1 is smaller than a second corrected low temperature side threshold Ta2" or a "state in which the battery temperature T1 is greater than a second corrected high temperature side threshold Tb2" continues over a predetermined specified time Ts or more. If affirmative determination is made, the process proceeds to S600. If negative determination is made, the process proceeds to S550 again. That is, in S580, it is determined whether the temperature abnormal state (Tr<Ta2 or Tr>Tb2) of the battery 30 continues for the specified time Ts or more.

In the present embodiment, the second corrected low temperature side threshold Ta2 is set as "−15° C.", the second corrected high temperature side threshold Tb2 is set as "85° C.", and the specified time Ts is set as "0.5 [sec]".

In S590, it is determined whether a "state in which the battery temperature T1 is smaller than a first corrected low temperature side threshold Ta1" or a "state in which the battery temperature T1 is higher than the first corrected high temperature side threshold Tb1" continues over the predetermined specified time Ts or more. If affirmative determination is made, the process proceeds to S600. If negative determination is made, the process proceeds to S550 again. That is, in S560, it is determined whether the temperature abnormal state (Tr<Ta1 or Tr>Tb1) of the battery 30 continues for the specified time Ts or more.

In the present embodiment, the first corrected low temperature side threshold Ta1 is set as "−20° C.", the first corrected high temperature side threshold Tb1 is set as "80° C.", and the specified time Ts is set as "0.5 [sec]".

If affirmative determination is made in S580 or in S590, the process proceeds to S600.

Since the process details in each step of S600 to S610 in the motor control process of the third embodiment are the same as those in each step of S210 to S220 in the motor control process of the first embodiment, the description thereof is not repeated.

In the motor control process configured as such, upon determining whether the temperature of the battery 30 is abnormal (S580, S590), not the low temperature side threshold Ta and the high temperature side threshold Tb used in the determination in S530 but the corrected threshold based on the current value Im ("first corrected low temperature side threshold Ta1 and first corrected high temperature side threshold Tb1" or "second corrected low temperature side threshold Ta2 and second corrected high temperature side threshold Tb2") are used.

As a result, the method of determining temperature abnormality in the battery 30 can be corrected so as to reduce the amount of variation in the battery temperature detection signal Vad (or battery temperature T1) due to the influence of the conducting current Id to the motor 20. As compared with the case of using the threshold Ta and Tb before corrected, determination accuracy of the temperature abnormality in the battery 30 can be improved.

Upon correcting the low temperature side threshold Ta and the high temperature side threshold Tb, if the current value Im is larger than the current determination threshold A, the "first corrected low temperature side threshold Ta1 and first corrected high temperature side threshold Tb1" of which temperature indicated by the threshold is high are used as the corrected thresholds. When the current value Im is equal to or smaller than the current determination threshold A, the "second corrected low temperature side threshold Ta2 and second corrected high temperature side threshold Tb2" of which temperature indicated by the threshold is low are used as the corrected thresholds.

Due to comparison with the battery temperature T1 using the corrected threshold which is a suitable value corresponding to the magnitude of the conducting current Id to the motor 20, determination accuracy of temperature abnormality in the battery 30 can be further improved.

[3-2. Effect]

As described above, the electric power tool 1 (tool body 5) of the third embodiment comprises the current detector 68 and the control unit 64 (in particular, the control unit 64 that executes S560 to S590 in the motor control process). The method of determining temperature abnormality in the battery 30 is corrected based on the current value Im of the conducting current Id to the motor 20, so as to reduce the amount of variation of the battery temperature T1 due to the influence of the conducting current Id to the motor 20.

Specifically, based on the current value Im of the conducting current Id to the motor 20, the thresholds (low temperature side threshold Ta and the high temperature side threshold Tb) to be compared with the battery temperature T1 are corrected. That is, in the process of determining whether the temperature of the battery 30 is abnormal (S580, S590), the corrected thresholds ("first corrected low temperature side threshold Ta1 and first corrected high temperature side threshold Tb1" or "second corrected low temperature side threshold Ta2 and second corrected high temperature side threshold Tb2") are used. In other words, the method of determining whether the temperature of the battery 30 is abnormal is corrected from the determination method using the thresholds (low temperature side threshold Ta and high temperature side threshold Tb) before corrected to the determination method using the corrected thresholds.

Thus, correction of the method of determining whether the temperature of the battery 30 is abnormal can reduce the error between the detected temperature information (battery temperature T1) and the actual temperature of the battery 30. This also makes it possible to inhibit decrease in abnormality determination accuracy in the process of determining whether the temperature of the battery 30 is abnormal (S580, S590).

Therefore, according to the electric power tool 1 (tool body 5) of the third embodiment, it is possible to suppress deterioration in detection accuracy of the battery temperature T1, and also suppress deterioration in abnormality determination accuracy in the determination process (S580, S590) on whether the temperature of the battery 30 is abnormal. Thus, unnecessary abnormality correction (motor stop process in S600) can be reduced. Deterioration in usability by the user can be suppressed.

An electric power tool 1 (tool body 5) of the third embodiment, in S570 to S590 of the motor control process, corrects the threshold so that the threshold (in other words, temperature indicated by the threshold) becomes high as the current value Im of the conducting current Id to the motor 20 is increased.

That is, the larger the current value Im of the conducting current Id to the motor 20 is, the larger the amount of variation of the battery temperature T1 is due to the influence of the conducting current Id, and the error between the detected battery temperature T1 and the actual temperature of the battery 30 increases. Therefore, the threshold (in other words, the temperature indicated by the threshold) is corrected as the current value Im of the conducting current Id to the motor 20 increases. Thereby, erroneous determination of the battery temperature can be reduced.

The control unit 64 executing S520 and S550 of the motor control process corresponds to an example of the temperature information detector of the present disclosure, and the control unit 64 executing S580 and S590 of the motor control process corresponds to an example of the abnormality determination unit of the present disclosure.

The current detector 68 and the control unit 64 executing S560 of the motor control process corresponds to an example of the current detector of the present disclosure, and the control unit 64 executing S570 to S590 of the motor control process corresponds to an example of the correction unit of is present disclosure.

4. Fourth Embodiment

An electric power tool of the fourth embodiment will be described. The electric power tool calculates the detected deviation value Er using the current value Im of the conducting current Id to the motor 20, and corrects the temperature determination reference values (low temperature side threshold Ta and high temperature side threshold Tb) using the detected deviation value Er.

The electric power tool of the fourth embodiment is different from the electric power tool 1 of the first embodiment in part of the process details of the motor control process, and is identical in other configurations. Therefore, the following description will be mainly given on the different part from the first embodiment, and the description of the same components denoted by the same reference numerals as in the first embodiment will not be repeated.

[4-1. Motor Control Process of the Fourth Embodiment]

Figure 7:
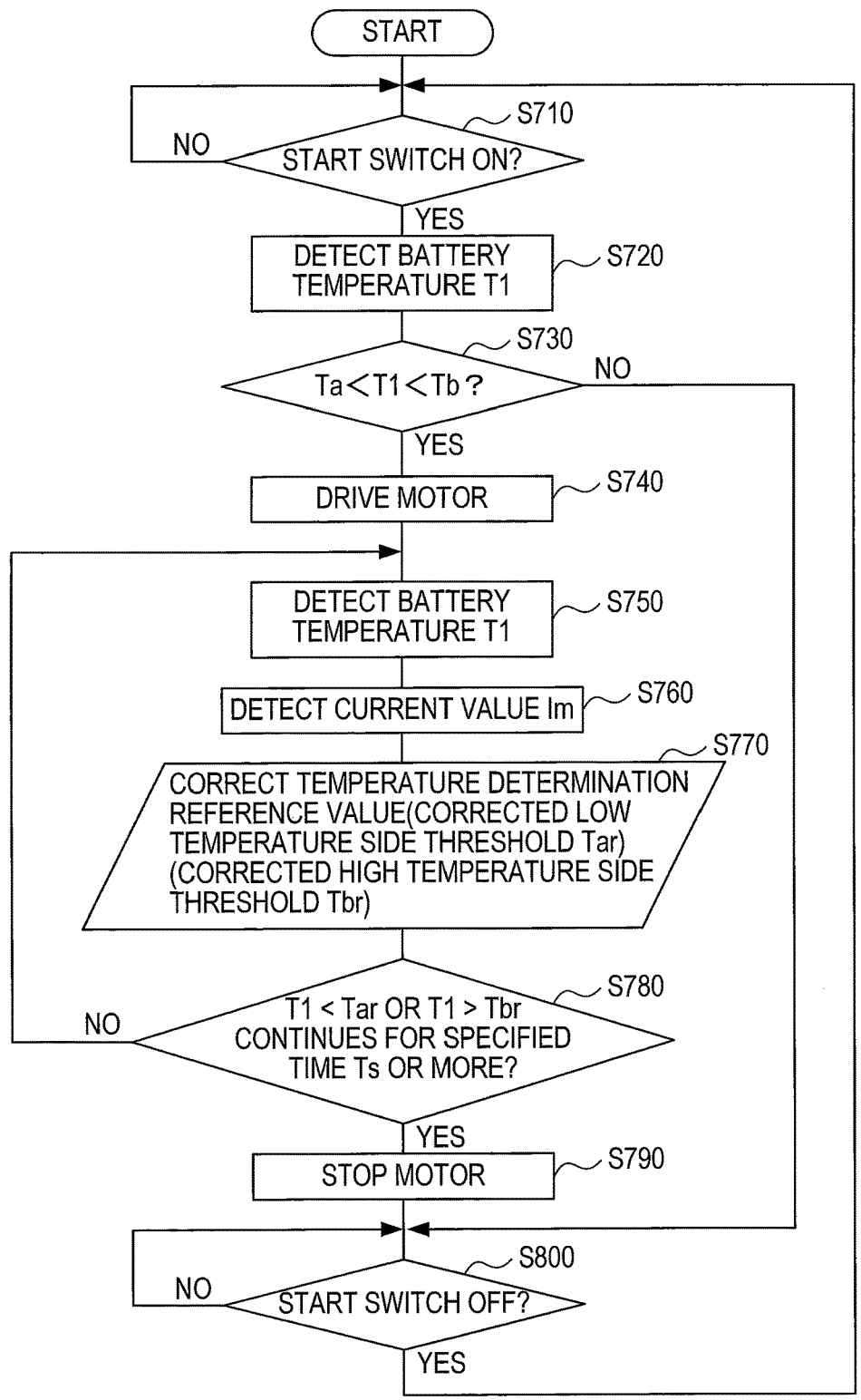
FIG. 7 is a flowchart showing process details of a motor control process in a fourth embodiment.

The motor control process performed by the control unit 64 of the electric power tool 1 (tool body 5) of the fourth embodiment will be explained. FIG. 7 is a flowchart showing process details of the motor control process in the fourth embodiment.

Since process details in each step of S710 to S760 in the motor control process of the fourth embodiment are the same as those in each step of S110 to S160 in the motor control process of the first embodiment, and thus the description is not repeated.

In S770 to be performed after S760, the detected deviation value Er is calculated using the current value Im detected in S760. The temperature determination reference values (low temperature side threshold Ta and high temperature side threshold Tb) are corrected using the detected deviation value Er. Thereby, the corrected thresholds (corrected low temperature side threshold Tar and corrected high temperature side threshold Tbr) are calculated.

Specifically, the detected deviation value Er [mV] is calculated using [Expression 1] described above, and the corrected thresholds (corrected low temperature side threshold Tar and corrected high temperature side threshold Tbr) are calculated using a correction data table shown in FIG. 8 corresponding to the detected deviation value Er.

Upon calculating the corrected threshold corresponding to the detected deviation value Er using the correction data table shown in FIG. 8, for each of the corrected low temperature side threshold Tar and the corrected high temperature side threshold Tbr, a numerical value recorded in a column corresponding to the detected deviation value Er acquired by [Expression 1] is set as the corrected threshold.

In subsequent S780, it is determined whether a "state in which the battery temperature T1 is smaller than the corrected low temperature side threshold Tar" or a "state in which the battery temperature T1 is greater than the corrected high temperature side threshold Tbr" continues over a predetermined specified time Ts or more. If affirmative determination is made, the process proceeds to S790. If negative determination is made, the process again moves to S750.

That is, in S780, it is determined whether the temperature abnormal state (T1<Tar or T1>Tbr) of the battery 30 continues for the specified time Ts or more. In this embodiment, 0.5 [sec] is set to the specified time Ts.

Since process details in each step of S790 to S800 in the motor control process of the fourth embodiment are the same as those in each step of S210 to S220 in the motor control process of the first embodiment, the description thereof is not repeated.

In the motor control process configured as such, upon determining whether the temperature of the battery 30 is abnormal (S780), not the low temperature side threshold Ta and high temperature side threshold Tb used in the determination in S730 but the thresholds (corrected low temperature side threshold Tar and corrected high temperature side threshold Tbr) corrected based on the current value Im are used.

As a result, the method of determining temperature abnormality in the battery 30 can be corrected so as to reduce the amount of variation in the battery temperature detection signal Vad (or battery temperature T1) due to the influence of the conducting current Id to the motor 20. As compared with the case of using the threshold Ta and Tb before corrected, determination accuracy of the temperature abnormality in the battery 30 can be improved.

Then, upon correcting the low temperature side threshold Ta and high temperature side threshold Tb, the detection deviation value Er is first calculated using the current value Im of the conducting current Id to the motor 20. Then, the low temperature side threshold Ta and high temperature side threshold Tb are corrected using the detected deviation value Er and the correction data table (FIG. 8) to set each of the corrected low temperature side threshold Tar and corrected high temperature side threshold Tbr.

Thus, comparison with the battery temperature T1 is made using the corrected thresholds (corrected low side threshold Tar and corrected high temperature side threshold Tbr) each having a suitable value corresponding to the magnitude of the conducting current Id to the motor 20. Determination accuracy of temperature abnormality in the battery 30 can be further improved.

[4-2. Effect]

As described above, the electric power tool 1 (tool body 5) of the present embodiment comprises the current detector 68 and control unit 64 (in particular, the control unit 64 executing S760 to S770 in the motor control process). The method of determining temperature abnormality in the battery 30 is corrected based on the current value Im of the conducting current Id to the motor 20 so as to reduce the amount of variation of the battery temperature T1 due to the influence of the conducting current Id to the motor 20.

More specifically, the detection deviation value Er is calculated based on the current value Im of the conducting current Id to the motor 20. Based on the detected deviation value Er, the thresholds to be compared with the battery temperature T1 (low temperature side threshold Ta and high temperature side threshold Tb) are corrected to acquire the corrected thresholds (corrected low temperature side threshold Tar and corrected high temperature side threshold Tbr).

In the process of determining whether the temperature of the battery 30 is abnormal (S780), not the thresholds before corrected (low temperature side threshold Ta and high temperature side threshold Tb) but the corrected thresholds (corrected low temperature side threshold Tar and corrected high temperature side threshold Tbr) are used to determine abnormal temperature of the battery 30. In other words, the method of determining whether the temperature of the battery 30 is abnormal is corrected from the determination method using the thresholds before corrected to the determination method using the corrected thresholds.

As mentioned above, correction of the method of determining whether the temperature of the battery 30 is abnormal can reduce the error between the detected temperature information (battery temperature T1) and the actual temperature of the battery 30. This also can inhibit decrease in abnormality determination accuracy in the processing of determining whether the temperature of the battery 30 is abnormal (S780).

According to the electric power tool 1 (tool body 5) of the fourth embodiment, it is possible to suppress deterioration in detection accuracy of the battery temperature T1, and also suppress deterioration in abnormality determination accuracy in the process of determining whether the temperature of the battery 30 is abnormal (S780). Thus, unnecessary abnormality correction (motor stop process in S790) can be reduced. Deterioration in usability by the user can be suppressed.

Then, the electric power tool 1 (tool body 5) of the fourth embodiment, in S770 of the motor control process, corrects the threshold (i.e., temperature indicated by the threshold) to be higher as the current value Im of the conducting current Id to the motor 20 increases, (see the correction data table of FIG. 8).

That is, the larger the current value Im of the conducting current Id to the motor 20 is, the larger the amount of variation of the battery temperature T1 due to the influence of the conducting current Id, and the error between the detected battery temperature T1 and the actual temperature of the battery 30 increases. Therefore, the threshold (in other words, the temperature indicated by the threshold) is corrected to increase as the current value Im of the conducting current Id to the motor 20 increases. Thereby, erroneous determination of the battery temperature can be reduced.

The control unit 64 executing S720 and S750 of the motor control process corresponds to an example of the temperature information detector of the present disclosure, and the control unit 64 executing S780 of the motor control process corresponds to an example of the abnormality determination unit of the present disclosure.

The current detector 68 and the control unit 64 executing S760 of the motor control process corresponds to an example of the current detector of the present disclosure, and the control unit 64 executing S770 of the motor control process corresponds to an example of the correction unit of the present disclosure.

5. Other Embodiments

Although exemplary embodiments of the present disclosure have been described above, the present disclosure is not intended to be limited to the above embodiments, but can be implemented in various aspects without departing from the scope of the present disclosure.

For example, in the first embodiment and the third embodiment, the numerical range that can be taken by the current value Im of the conducting current Id to the motor 20 is divided into the two current regions (two current region delimited by the current determination threshold A), and the correction amount (each correction amount for the battery temperature T1, low temperature side threshold Ta, and high temperature side threshold Tb) of each of the current regions are determined. The number of the plurality of current regions is not limited to two as mentioned above, and may be three or more. In this way, as the number of the plurality of current regions increases, the range that can be taken by the current value Im can be further subdivided. It is possible to set an appropriate correction method for each current region.

If the number of the plurality of current regions increases too much, the correction process in the correction unit will be complicated. There is a possibility that the processing load is excessive. Therefore, the number of the plurality of current regions may be set to 16 or less. Thus, it is possible to reduce complexity of the correction process in the correction unit and can prevent the processing load from being excessive.

Moreover, each occupied range (size) of the plurality of current regions is not limited to be equal to each other. Upon dividing the numerical range that can be taken by the current value Im into a plurality of current regions, there may be a current region of which occupied range is different from those of other current regions. For example, in the range that can be taken by the current value Im, the occupied range of one current region where small changes for the correction method are required may be set smaller. The occupied range of one current region where small changes for the correction method are not required may be set larger.

In the above embodiments, as abnormality correction when the battery temperature is determined abnormal, the process of stopping the motor is performed. The embodiments of the present disclosure are not necessarily limited to such configuration. For example, abnormality correction when the battery temperature is determined abnormal may be configured to execute a process for limiting the conducting current to the motor (limited to a predetermined tolerance or less). Limitation in this manner of the conducting current to the motor can reduce heat generation amount of the battery while maintaining the drive of the motor.

In the above embodiments, the start switch (trigger switch) is configured to be coupled only to the control unit. The embodiments of the present disclosure are not limited to such configuration. For example, the start switch may be provided on the current path, and may be configured to flow and interrupt the conducting current to the motor.

Each value of the variables (low temperature side threshold Ta, high temperature side threshold Tb, specified time Ts, current determination threshold A, etc.) used in the above embodiments is not limited to the numerical value noted above. An appropriate value may be set in which various factors such as use application and use environment are taken into consideration.

In the above embodiments, the correction data table shown in FIG. 5 includes records of corrected temperatures Tr per 1° C. with respect to the battery temperature T1, but is not limited to such a configuration. For example, the correction data table may include records of corrected temperatures Tr per 0.5° C. with respect to the battery temperature T1, or, records of corrected temperatures Tr per 2° C. with respect to the battery temperature T1.

Figure 9:
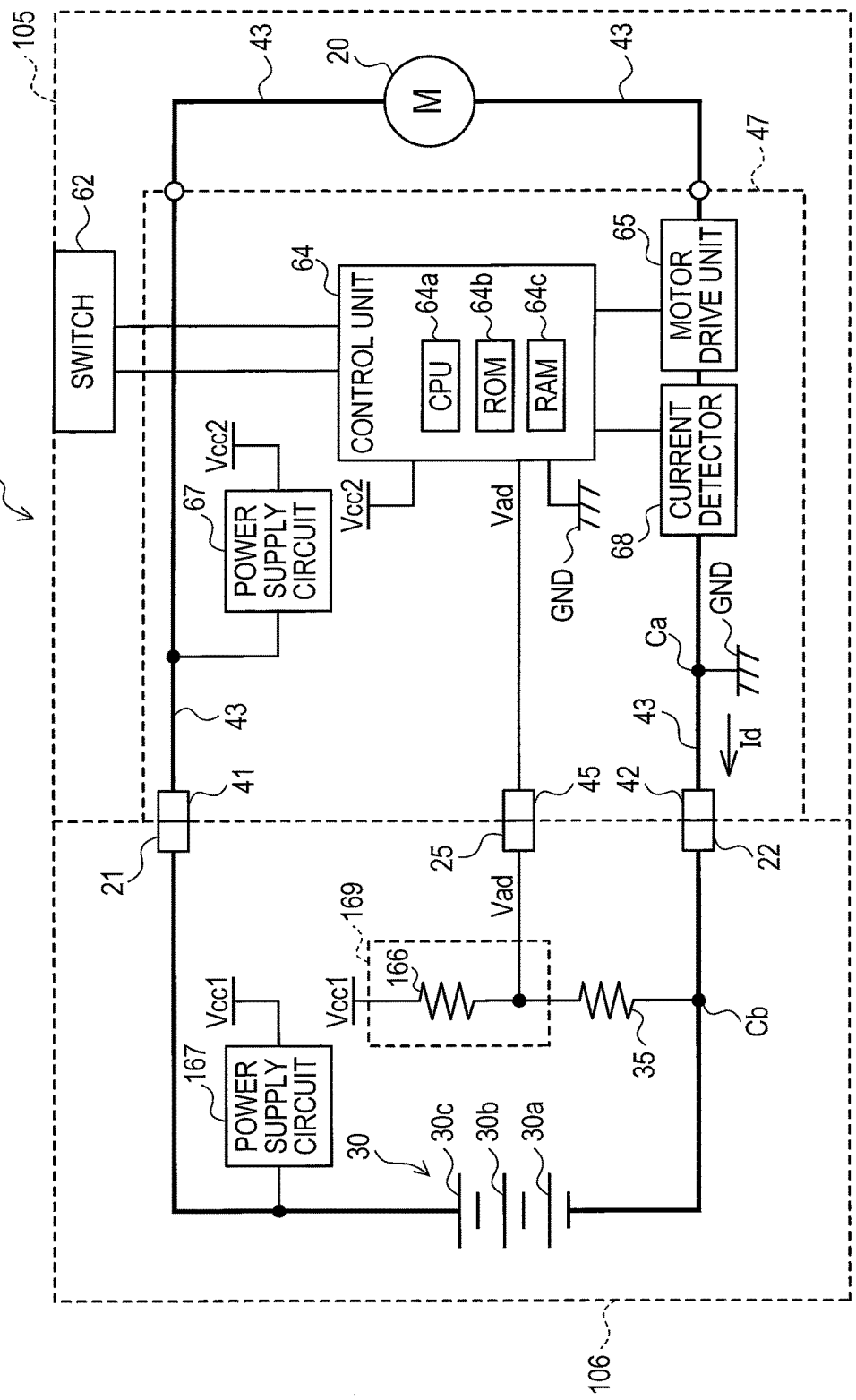
FIG. 9 is a block diagram showing an electrical configuration of a second tool body and a second battery pack in a second electric power tool.

In the above embodiments, the electric power tool 1 has been described that is configured to comprise in the tool body 5 the temperature signal generator 69 for supplying current or applying voltage to the thermistor 35. However, there is no necessity to be limited to such configuration. For example, like the second power tool 101 shown in FIG. 9, a temperature signal generator may not be provided in the second tool body 105, but a second temperature signal generator 169 may be provided in the second battery pack 106. The second temperature signal generator 169 is configured to supply current or apply voltage to the thermistor 35.

The second battery pack 106 comprises a second power supply circuit 167. The second power supply circuit 167, when battery voltage from the battery 30 is input, steps down the battery voltage to a power supply voltage Vcc1 having a predetermined voltage value and outputs the power supply voltage Vcc1. The power supply voltage Vcc1 generated in the second power supply circuit 167 is used as an operating power supply of each unit (not shown) of the second battery pack 106 including the second temperature signal generator 169. The power supply circuit 67 provided in the second tool body 105, when the battery voltage from the battery 30 is input, steps down the battery voltage to a power supply voltage Vcc2 having a predetermined voltage value and outputs the power supply voltage Vcc2. The power supply voltage Vcc2 generated in the power supply circuit 67 is used as the operating power supply of each unit of the second tool body 105 including the control unit 64. The power supply voltage Vcc2 generated in the power supply circuit 67 and the power supply voltage Vcc1 generated in the second power supply circuit 167 may have the same voltage value or may have different voltage values.

The second electric power tool 101 corresponds to an example of the motor-driven device, the second tool body 105 corresponds to an example of the device body, the second battery pack 106 corresponds to an example of the battery pack, and the second temperature signal generator 169 corresponds to an example of the temperature signal generator.

The functions of one component in the above embodiments may be dispersed to a plurality of components, or the functions of a plurality of components may be integrated to a single component. Further, at least part of the configuration in any of the above embodiments may be replaced with a known configuration having a similar function. It is also possible to omit part of the configuration in any of the above embodiments. Further, at least part of the configuration in any of the above embodiments may be added or substituted to the configuration of the other of the above embodiments. All aspects included in the technical idea specified only by the language set forth in the appended claims are regarded as embodiments of the present disclosure.

The motor-driven device to which the present disclosure is applied is not limited to the above-described electric power tool (impact driver), but includes power tools for masonry, power tools for metalworking, power tools for woodworking, power tools for gardening, and the like. More specifically, the present disclosure can be applied to motor-driven devices such as electric hammers, electric hammer drills, electric drills, electric screwdrivers, electric wrenches, electric grinders, electric circular saws, electric reciprocating saws, electric jigsaws, electric hammers, electric cutters, electric chain saws, electric planers, electric nailing machines (including tackers), electric hedge trimmers, electric lawn mowers, electric lawn clippers, electric brush cutters, electric cleaners, electric blowers, and so on.

What is claimed is:

1. A device body comprising:
    a motor configured to be driven by electric power supplied from a battery pack that is separate from, but attachable to, the device body, the battery pack comprising a battery, a temperature detector configured to vary a resistance value thereof in accordance with temperature of the battery, a positive electrode, a negative electrode, and a battery-side signal terminal configured to output from the battery pack a temperature signal of which voltage value is changed in accordance with change in the resistance value of the temperature detector;
    a current path configured to pass a conducting current to the motor therethrough;
    a positive terminal configured to be coupled to the positive electrode of the battery pack;
    a negative terminal configured to be coupled to the negative electrode of the battery pack, an electric potential of the negative terminal being set to a reference electric potential of the current path;
    a device-side signal terminal configured to be coupled to the battery-side signal terminal of the battery pack and to receive the temperature signal;
    a temperature information detector configured to detect temperature information indicating the temperature of the battery based on a temperature detection voltage value, the temperature detection voltage value being a voltage value of the device-side signal terminal with respect to the reference electric potential;
    a current detector configured to detect a current value of the conducting current; and
    a correction unit configured to correct the temperature information based on the current value so as to reduce influence given to the temperature information by the conducting current.

2. The device body according to claim 1, wherein at least one of the device body and the battery pack comprises a temperature signal generator configured to supply one of current and voltage to the temperature detector.

3. The device body according to claim 1, wherein the correction unit is configured to correct the temperature information such that the temperature of the battery indicated by the temperature information becomes lower as the current value increases.

4. The device body according to claim 1, further comprising:
    a motor control unit configured to drive and control the motor; and
    an abnormality determination unit configured to determine whether the temperature of the battery is abnormal based on the temperature information and a temperature determination reference value for determining temperature abnormality of the battery.

5. The device body according to claim 4, wherein the correction unit is configured to correct the temperature determination reference value based on the current value so as to reduce the influence.

6. The device body according to claim 5, wherein the correction unit is configured to correct the temperature determination reference value to be higher as the current value increases.

7. The device body according to claim 4, wherein the motor control unit is configured to perform at least one of reduction and suspension of the conducting current to the motor when the temperature of the battery is determined abnormal by the abnormality determination unit.

8. The device body according to claim 1, wherein the correction unit is configured to perform a plurality of correction methods as a method of correcting the temperature information, each of the plurality of correction methods corresponding to a mutual different one of a plurality of current regions, the plurality of current regions corresponding to a plurality of ranges that can be taken by the current value.

9. The device body according to claim 8, wherein the plurality of current regions comprise 16 or fewer current regions.

10. A motor-driven device comprising:
    a battery pack; and
    a device body,
    the battery pack comprising:
        a battery;
        a temperature detector configured to vary a resistance value according to a temperature of the battery;
        a positive electrode;
        a negative electrode; and
        a battery-side signal terminal configured to output from the battery pack a temperature signal of which voltage value is changed in accordance with change in the resistance value of the temperature detector,
    the device body comprising:
        a motor configured to be driven by electric power supplied from the battery pack;
        a current path configured to pass a conducting current to the motor therethrough;
        a positive terminal configured to be coupled to the positive electrode of the battery pack;

a negative terminal configured to be coupled to the negative electrode of the battery pack, an electric potential of the negative terminal being set to a reference electric potential of the current path;
a device-side signal terminal configured to be coupled to the battery-side signal terminal of the battery pack and to receive the temperature signal;
a temperature information detector configured to detect temperature information indicating the temperature of the battery based on a temperature detection voltage value, the temperature detection voltage value being a voltage value of the device-side signal terminal with respect to the reference electric potential;
a current detector configured to detect a value of the conducting current; and
a correction unit configured to correct the temperature information based on the current value so as to reduce influence given to the temperature information by the conducting current.

11. A method of detecting a temperature of a battery that supplies electric power to a motor, the method comprising:
detecting temperature information indicating the temperature of the battery based on a temperature detection value supplied from a temperature detector, the temperature detector being configured such that a resistance value thereof changes in accordance with the temperature of the battery, the temperature detection value changing in accordance with the resistance value;
detecting a value of a conducting current to the motor; and
correcting the temperature information based on the detected value so as to reduce influence given to the temperature information by the conducting current.

12. A tool body comprising:
a start switch;
a motor;
a tool power supply circuit configured to generate a tool power supply voltage (Vcctool);
a control unit;
a motor drive unit;
a current detector configured to detect a current value (Im);
a tool-side negative terminal;
a first node located between the tool-side negative terminal and the current detector, and having a first node voltage (Vca);
a tool-side positive terminal; and
a tool-side temperature signal terminal,
wherein the tool body is configured to mate with a battery pack,
wherein the battery pack includes:
a battery-side positive terminal,
a battery-side temperature signal terminal,
a battery-side negative terminal,
a thermistor directly connecting the battery-side temperature signal terminal to the battery-side negative terminal,
a battery connecting the battery-side positive terminal to the battery-side negative terminal, and
a second node located between the battery-side negative terminal and a negative side of the battery, and having a second node voltage (Vcb), such that Vca>Vcb.

13. The tool body of claim 12, further including:
a first resistor connecting the tool power supply voltage (Vcctool) to the tool-side temperature signal terminal.

14. The tool body of claim 12, wherein the battery pack further includes:
a battery pack power supply circuit configured to generate a battery pack power supply voltage (Vccbatterypack), and
a first resistor connecting the battery pack power supply voltage Vccbatterypack to the battery-side temperature signal terminal.

15. The tool body of claim 12, wherein the control unit is configured to:
determine that the start switch is on;
detect a battery temperature (T1) based at least partly upon a battery temperature detection signal (Vad);
determine that Ta<T1<Tb, wherein Ta is a low temperature threshold and Tb is a high temperature threshold;
drive the motor;
detect the battery temperature (T1);
detect the current value (Im); and
determine whether a threshold current (Ithresh) is <the current value (Im).

16. The tool body of claim 15, wherein the control unit is further configured to:
determine that Ithresh<Im;
correct T1 by a relatively large correction amount (Ra) to generate a corrected temperature (Tr);
determine that at least one of the following conditions is true:
a) Tr<Ta for at least a specified time (Ts), and
b) Tr>Tb for at least the specified time (Ts);
stop the motor; and
determine whether or not the start switch is OFF.

17. The tool body of claim 15, wherein the control unit is further configured to:
determine that Ithresh≥Im;
correct T1 by a relatively small correction amount (Ra) to generate a corrected temperature (Tr);
determine that at least one of the following conditions is true:
a) Tr<Ta for at least a specified time (Ts), and
b) Tr>Tb for at least the specified time (Ts);
stop the motor; and
determine whether or not the start switch is OFF.

18. The tool body of claim 12, wherein the control unit is configured to:
determine that the start switch is on;
detect a battery temperature (T1) based at least partly upon a battery temperature detection signal (Vad);
determine that Ta<T1<Tb, wherein Ta is a low temperature threshold and Tb is a high temperature threshold;
drive the motor;
detect the battery temperature (T1);
detect the current value (Im);
correct T1 to generate a corrected temperature Tr based at least partly on a detected deviation value (Er);
determine that at least one of the following conditions is true:
a) Tr<Ta for at least a specified time (Ts), and
b) Tr>Tb for at least the specified time (Ts);
stop the motor; and
determine whether or not the start switch is OFF.

19. The tool body of claim 12, wherein the control unit is configured to:
determine that the start switch is on;
detect a battery temperature (T1) based at least partly upon a battery temperature detection signal (Vad);
determine that Ta<T1<Tb, wherein Ta is a low temperature threshold and Tb is a high temperature threshold;

drive the motor;
detect the battery temperature (T1);
detect the current value (Im);
determine that a first threshold current≥the current value (Im);
determine a first corrected low temperature threshold (Ta1) and a first corrected high temperature threshold (Tb1);
determine that at least one of the following conditions is true:
   a) T1<Ta1 for at least a specified time (Ts), and
   b) T1>Tb1 for at least the specified time (Ts);
stop the motor; and
determine whether or not the start switch is OFF.

20. The tool body of claim 12, wherein the control unit is configured to:
determine that the start switch is on;
detect a battery temperature (T1) based at least partly upon a battery temperature detection signal (Vad);
determine that Ta<T1<Tb, wherein Ta is a low temperature threshold and Tb is a high temperature threshold;
drive the motor;
detect the battery temperature (T1);
detect the current value (Im);
determine that a first threshold current<the current value (Im);
determine a corrected low temperature threshold (Ta2) and a corrected high temperature threshold (Tb2);
determine that at least one of the following conditions is true:
   a) T1<Ta2 for at least a specified time (Ts), and
   b) T1>Tb2 for at least the specified time (Ts);
stop the motor; and
determine whether or not the start switch is OFF.

21. The tool body of claim 12, wherein the control unit is configured to:
determine that the start switch is on;
detect a battery temperature (T1) based at least partly upon a battery temperature detection signal (Vad);
determine that Ta<T1<Tb, wherein Ta is a low temperature threshold and Tb is a high temperature threshold;
drive the motor;
detect the battery temperature (T1);
detect the current value (Im);
generate a corrected low temperature threshold (Tar) based at least partly on a detected deviation value (Er), and generate a corrected high temperature threshold (Tbr) based at least partly on the detected deviation value (Er);
determine that at least one of the following conditions is true:
   a) T1<Tar for at least a specified time (Ts), and
   b) T1>Tbr for at least the specified time (Ts);
stop the motor; and
determine whether or not the start switch is OFF.

* * * * *